United States Patent [19]
Anderson

[11] 4,217,574
[45] Aug. 12, 1980

[54] ANALOG TO DIGITAL CONVERTER HAVING NONLINEAR AMPLITUDE TRANSFORMATION

[75] Inventor: Bruce C. Anderson, Tewksbury, Mass.

[73] Assignee: GTE Laboratories Incorporated, Waltham, Mass.

[21] Appl. No.: 712,634

[22] Filed: Aug. 9, 1976

[51] Int. Cl.² .......................................... H03K 13/175
[52] U.S. Cl. .............................. 340/347 AD; 358/32
[58] Field of Search ................... 340/347 AD, 347 M; 358/32, 141, 13, 164

[56] References Cited

U.S. PATENT DOCUMENTS

| | | | |
|---|---|---|---|
| 3,585,631 | 6/1971 | McCown | 340/347 AD |
| 3,737,894 | 6/1973 | Poretti | 340/347 AD |
| 3,949,170 | 4/1976 | Shionoya | 358/141 |

Primary Examiner—Charles D. Miller
Attorney, Agent, or Firm—Fred Fisher

[57] ABSTRACT

An analog to digital converter simultaneously digitizes a gamma corrected analog video signal and removes the gamma correction. The converter has a plurality of parallel analog comparators which compare the video signal amplitude with the amplitude of a plurality of different reference signals, each comparator providing an output representative of the respective comparison result. Each reference signal amplitude is a different multiple of a fraction, of a common reference signal, raised to the gamma power thereby removing the gamma correction. A decoder responsive to the output of the comparators generates the digital output signal in a preselected digital code.

7 Claims, 1 Drawing Figure

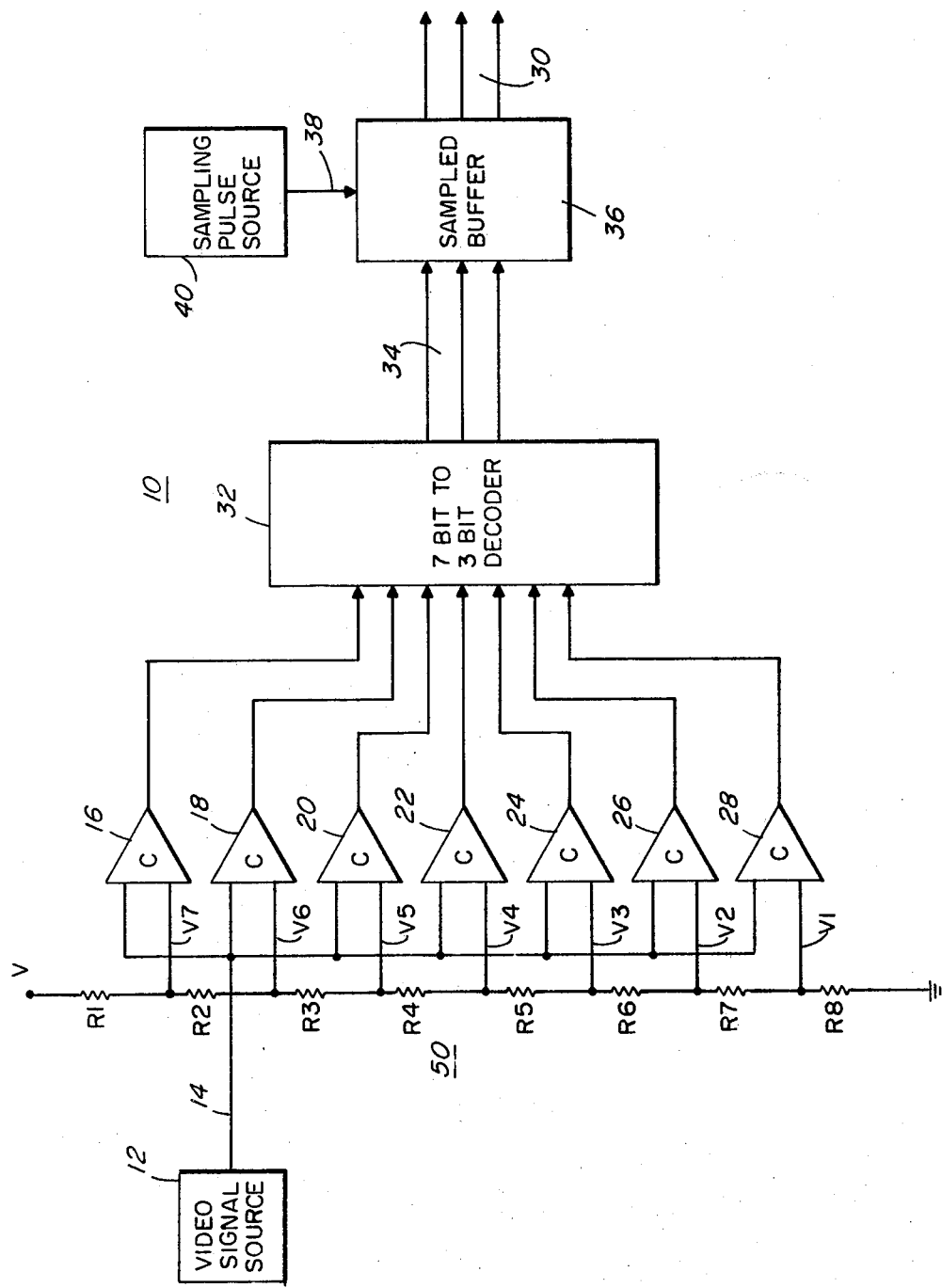

ANALOG TO DIGITAL CONVERTER HAVING NONLINEAR AMPLITUDE TRANSFORMATION

BACKGROUND OF THE INVENTION

The present invention relates to an analog to digital converter for processing a video signal and, more specifically, to a converter for use in a television system in which a gamma correction is either removed from a gamma corrected video signal or incorporated into a video signal.

Gamma correction is the nonlinear amplitude transformation carried out on a video signal primarily for color television transmission. The primary function of gamma correction is to control the overall amplitude transfer characteristic of the television system between the camera scene and the reproduced picture. Cathode ray picture tubes have transfer characteristics of approximately the form $Y = k E^{2.2}$ over most of their useful range of operation, E being the gun drive voltage above cutoff and Y the displayed luminance. The provision of a transducer at the video source having a transfer characteristic of the form $E_o = k Y_i^\gamma$, $E_o$ being the amplitude of the output video signal and $Y_i$ being the original scene luminance respectively, and $\gamma$ being the gamma correction and being equal to 1/2.2, renders the television system essentially linear if it contains no nonlinear transducers other than the gamma corrector and the picture tube. Accordingly, as is well known, the standard NTSC video signal, which is $E_o$ in the above equation, is proportional to the original scene luminance raised to the 1/2.2 power.

In a television system which does not use a cathode ray tube for a display device and which uses an NTSC signal, it becomes necessary to remove the gamma correction from the NTSC video signal for optimum picture reproduction. One method of effecting this removal is the provision of a nonlinear analog signal transducer in series or parallel with the NTSC video signal source. While this method is generally satisfactory, it has several limitations, including limited dynamic range, the less than optimum accuracy of gamma correction removal over the dynamic range of the transducer, and limited bandwidth. Also, in some television receiver systems, such as most plasma panel display systems, it is also necessary to convert the video signal into digital form. One known method for removing the gamma correction in such a receiver is to linearly convert the analog video signal into digital form and then to use a digital processing scheme to raise the digital value to the $1/\gamma$ power. While this method provides the desired result, it has the disadvantages of requiring relatively complex circuitry and being expensive in providing sufficient speed for video data rates.

Also, in television systems which do use a cathode ray picture tube and which do not use the standard NTSC signal it becomes necessary to introduce a gamma correction by raising the video signal to the $\gamma$ power. Also, the video signal is frequently converted into digital form, such as for transmission or storage. In such instances, the previously mentioned methods for removing the gamma correction may be used for providing the actual gamma correction, but they also have essentially the same limitations as previously discussed.

SUMMARY OF THE INVENTION

It is an object of the present invention to provide an improved analog to digital converter which simultaneously removes a gamma correction from a gamma corrected analog video signal in an ecomonical and uncomplicated fashion.

It is another object of the invention to provide an improved analog to digital converter which simultaneously provides a gamma correction to an analog video signal in an ecomonical and uncomplicated fashion.

According to one aspect of the present invention, there is provided an analog to digital converter for converting an analog video signal into a digital signal which is a nonlinear function of the video signal. The converter includes a plurality of analog comparators, and each of the comparators receives the analog signal at an input. Also, a reference signal network provides a different reference signal to another input of each of the comparators for amplitude comparison with the analog signal. The amplitudes of the respective reference signals have a preselected nonlinear relationship. The plurality of comparators provides a digital output that indicates which reference signal the amplitude of the input signal is greater than. The converter also includes a device for decoding the continuous output of the comparators into a predetermined digital code.

In another aspect of the invention, the predetermined digital code is a binary digital code having n bits, and the number of comparators is $2^n - 1$. In the preferred embodiment, the video signal is a gamma corrected video signal, and the nonlinear relationship is such that the different reference signals vary by multiples of a fraction, of a common reference signal, raised to the $\gamma$ power to remove the gamma correction from the video signal. In another aspect, the video signal is a non-gamma corrected video signal, and the nonlinear relationship is such that the different reference signals vary by multiples of a fraction, of a common reference signal, raised to $1/\gamma$ power to insert a gamma correction into the digitized video signal.

BRIEF DESCRIPTION OF THE DRAWING

In the Drawing:

The sole FIGURE is a detailed block diagram of an analog to digital converter according to the present invention.

BRIEF DESCRIPTION OF THE PREFERRED EMBODIMENTS

In an exemplary embodiment of the present invention as illustrated in the FIGURE, there is provided an analog to digital converter, represented generally by the reference numeral 10, for digitizing and removing the gamma correction from a gamma corrected analog video signal from a source 12. The converter 10 includes a comparator network for continuously comparing the amplitude of the video signal at 14 with the amplitude of a reference signal. The comparator network has a plurality of analog comparators, represented by the reference numerals 16, 18, 20, 22, 24, 26 and 28. The number of comparators is selected to be equal to $2^n - 1$ wherein n is an integer equal to the number of bits of a binary digital signal representative of the analog video signal. In the embodiment, a three-bit binary digital code is provided at an output 30 of the converter 10 and accordingly, seven converters are shown in the embodiment. Each of the comparators receive the analog video signal at an input.

The converter 10 has a reference signal device for providing a different reference signal to each of the comparators for amplitude comparison with the analog video signal. The amplitudes of the respective reference signals vary from each other by multiples of a fraction, of a common reference signal, raised to the γ power. Accordingly, the gamma correction is removed from the signal as the signal is being converter into digital form. The plurality of comparators provides a digital output that indicates which reference signal the amplitude of the video signal is greater than.

The outputs of the comparators are coupled to a device for decoding the continuous outputs of the comparators into a predetermined digital code, such as a standard binary code, having n bits of information. In the embodiment this device is illustrated as a seven bit to three bit decoder 32. The decoded output at 34 of the decoder 32 is coupled to a sampled buffer 36 which may include a group of master/slave flip-flops which are controlled by a pulse on line 38 from a sampling pulse source 40. Accordingly, the output at 30 of the converter 10 is a time sampled digital output representative of the instantaneous analog amplitude of the video signal.

The reference signal device preferably includes a voltage divider network, represented generally by the reference numeral 50. The voltage divider 50 includes a plurality of resistors represented by the reference numerals R1 through R8, which are coupled in series between a reference voltage V and ground. The values of the resistors R1 through R8 are selected to provide the proper reference signal amplitude at each junction of the resistors to remove the gamma correction from the analog video signal.

The reference signal amplitude for each of the seven comparators is equal to $$\left[ (E2 - E1) \frac{X}{M+1} \right]^\gamma + E1$$

where

E1=minimum amplitude of the video signal (black level)
E2=maximum amplitude of the video signal (white level)
X=number of the respective comparator
M=total number of comparators, $2^n - 1$
γ=gamma, 1/2.2

For the case wherein E1 is 0 volts, E2 is 1 volt, M is 7 and γ is 1/2.2, the values of the seven reference signal amplitudes which are identified in the drawing as V1 through V7 are indicated as follows.

| V1 | .386v |
|----|-------|
| V2 | .532v |
| V3 | .641v |
| V4 | .729v |
| V5 | .808v |
| V6 | .877v |
| V7 | .941v |

Accordingly, the reference signals vary from each other by multiples of a fraction (⅛, 2/8, etc.), of a common reference signal, raised to the γ power.

There are several advantages to the circuit according to the present invention. First, the gamma correction is provided by the analog to digital converter itself, rather than in a preceding analog gamma corrector or in a digital gamma corrector which follows the converter. When used in a system which has an analog input and which requires a digital output, the need for a separate gamma corrector is eliminated. Also, since the reference signals used to determine the switching levels of the comparators are usually generated by a voltage resistance divider, this invention requires only that the relative values of these resistors be properly chosen.

In another aspect of the invention, the circuit in the drawing may also be used for inserting a gamma correction with a non-gamma corrected video signal. The only difference between the circuits is the selection of resistors R1 through R8 in accordance with the following equation:

$$\left[ (E2 - E1) \frac{X}{M+1} \right]^{1/\gamma} + E1$$

For the case wherein E1 is 0 volts, E2 is 1 volt, M is 7, and 1/γ is 2.2, the values of the seven reference signal amplitudes are indicated as follows:

| V1 | .010v |
|----|-------|
| V2 | .047v |
| V3 | .116v |
| V4 | .217v |
| V5 | .339v |
| V6 | .531v |
| V7 | .745v |

The embodiments of the present invention are intended to be merely exemplary and those skilled in the art shall be able to make numerous variations and modifications of them without departing from the spirit of the present invention. All such variations and modifications are intended to be within the scope of the present invention as defined by the claims.

I claim:

1. An analog to digital converter for converting an analog gamma corrected input video signal into a digital output signal which is a nonlinear function of the input signal, including:
   (a) a plurality of analog comparators, each of the comparators receiving the analog input video signal at an input,
   (b) reference signal means providing a different reference signal to another input of each of the plurality of comparators for amplitude comparison with the input signal, the amplitudes of the respective reference signals having a preselected nonlinear relationship such that the different reference signals vary by multiples of a fraction, of a common reference signal, raised to the γ power to remove the gamma correction from the video signal, the plurality of comparators providing a digital output that indicates which reference signal the amplitude of the input signal is greater than, and
   (c) means for decoding the continuous outputs of the plurality of comparators to form the digital output signal having a predetermined digital code.

2. The converter according to claim 1 wherein the predetermined digital code is a binary digital code having n bits and the number of comparators is equal to $2^n - 1$ and wherein the reference signal amplitude for each of the $2^n - 1$ comparators is equal to $$\left[ (E2 - E1)\frac{X}{M+1} \right]^{\gamma} + E1$$

where
- E1 = minimum amplitude of the video signal (black level)
- E2 = maximum amplitude of the video signal (white level)
- X = number of the respective comparator
- M = total number of comparators, $2^n - 1$
- $\gamma$ = gamma, 1/2.2.

3. The converter according to claim 2 wherein the reference signal means includes a voltage divider network having a plurality of resistors coupled in series between a common reference signal, the reference signals for the comparators being taken from the junctions of the resistors.

4. An analog to digital converter for converting a gamma corrected analog video signal into a digital output signal and for removing the gamma correction, including:

(a) $2^n - 1$ analog comparators where n is an integer equal to the number of bits of a binary digital signal representative of the analog video signal, each of the comparators receiving the analog video signal at an input, (b) reference signal means providing a different reference signal to another input of each of the comparators for amplitude comparison with the video signal, the amplitudes of the respective reference signals varying by multiples of a fraction equal to $\frac{1}{2}^n$, of a common reference signal, raised to the $\gamma$ power to remove the gamma correction from the video signal, the analog comparators providing a digital output that indicates which reference signal the amplitude of the analog video signal is greater than, and (c) means for decoding the continuous outputs of comparators to form the digital output signal having a binary digital code.

5. An analog to digital converter for converting an analog video signal into a digital output signal and for inserting a gamma correction into the digital signal, including:

(a) $2^n - 1$ analog comparators where n is an integer equal to the number of bits of a binary digital signal representative of the analog video signal, each of the comparators receiving the analog video signal at an input, (b) reference signal means providing a different reference signal to another input of each of the plurality of comparators for amplitude comparison with the analog video signal, the amplitudes of the respective reference signals varying from each other by multiples of a fraction equal to $\frac{1}{2}^n$, of a common reference signal, raised to the $1/\gamma$ power to insert the gamma correction into the video signal, the analog comparators providing a digital output that indicates which reference signal the amplitude of the analog video signal is greater than, and (c) means for decoding the continuous outputs of the comparators to form the digital output signal having a binary digital code.

6. An analog to digital converter for converting an analog input video signal into a digital output signal which is a nonlinear function of the input signal, including:

(a) a plurality of analog comparators, each of the comparators receiving the analog input video signal at an input, (b) reference signal means providing a different reference signal to another input of each of the plurality of comparators for amplitude comparison with the input signal, the amplitudes of the respective reference signals having a preselected nonlinear relationship such that different reference signals vary by multiples of a fraction, of a common reference signal, raised to $1/\gamma$ to produce a gamma corrected video signal, the plurality of comparators providing a digital output that indicates which reference signal the amplitude of the input signal is greater than, and (c) means for decoding the continuous outputs of the plurality of comparators to form the digital output signal having a predetermined digital code.

7. The converter according to claim 6 wherein the predetermined digital code is a binary digital code having n bits and the number of comparators is equal to $2^n - 1$ and wherein the reference signal amplitude for each of the $2^n - 1$ comparators is equal to $$\left[ (E2 - E1)\frac{X}{M+1} \right]^{1/\gamma} + E1$$

where
- E1 = minimum amplitude of the video signal (black level)
- E2 = maximum amplitude of the video signal (white level)
- X = number of the respective comparator
- M = total number of comparators, $2^n - 1$
- $\gamma$ = gamma, 1/2.2.

* * * * *